(12) United States Patent
Matsushima et al.

(10) Patent No.: US 11,004,682 B2
(45) Date of Patent: May 11, 2021

(54) LASER ANNEALING APPARATUS, LASER ANNEALING METHOD, AND MASK

(71) Applicant: SAKAI DISPLAY PRODUCTS CORPORATION, Sakai (JP)

(72) Inventors: Yoshiaki Matsushima, Sakai (JP); Takeshi Uno, Sakai (JP); Yuta Sugawara, Sakai (JP); Kota Imanishi, Sakai (JP); Nobutake Nodera, Sakai (JP); Takao Matsumoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 151 days.

(21) Appl. No.: 16/468,802

(22) PCT Filed: Dec. 15, 2016

(86) PCT No.: PCT/JP2016/087432
§ 371 (c)(1),
(2) Date: Oct. 30, 2019

(87) PCT Pub. No.: WO2018/109912
PCT Pub. Date: Jun. 21, 2018

(65) Prior Publication Data
US 2020/0098557 A1 Mar. 26, 2020

(51) Int. Cl.
*H01L 21/02* (2006.01)
*B23K 26/352* (2014.01)
(Continued)

(52) U.S. Cl.
CPC .......... *H01L 21/0268* (2013.01); *B23K 26/18* (2013.01); *B23K 26/352* (2015.10);
(Continued)

(58) Field of Classification Search
CPC .......... H01L 21/0268; H01L 21/67115; H01L 21/02678; H01L 21/02686; B23K 26/066; B23K 26/067
See application file for complete search history.

(56) References Cited

U.S. PATENT DOCUMENTS 6,809,013 B2 10/2004 Ito
6,992,274 B2 1/2006 Ito
(Continued)

FOREIGN PATENT DOCUMENTS

JP 2002-324759 A 11/2002
JP 2005-536874 A 12/2005
(Continued)

*Primary Examiner* — Bac H Au
(74) *Attorney, Agent, or Firm* — ScienBiziP, P.C.

(57) ABSTRACT

Provided are a laser annealing apparatus, a laser annealing method, and a mask with which scan nonuniformity can be decreased. According to the present invention, all or some openings of a plurality of openings are configured so that a partial subregion of a prescribed region is irradiated with laser light. The plurality of openings are configured so that, between prescribed regions irradiated with laser light via a group of openings in one row arranged in a row direction and prescribed regions irradiated with laser light via a group of openings in another row arranged in the row direction, the number of times of laser light radiations in subregions having the same occupying region is the same, and at least two openings of a group of openings arranged in a column direction have different positions or shapes.

7 Claims, 12 Drawing Sheets

(51) Int. Cl.
*B23K 26/18* (2006.01)
*H01L 21/268* (2006.01)
*H01L 21/67* (2006.01)
*H01L 27/12* (2006.01)

(52) U.S. Cl.
CPC ...... *H01L 21/268* (2013.01); *H01L 21/67115* (2013.01); *H01L 27/1274* (2013.01)

(56) References Cited

U.S. PATENT DOCUMENTS

| | | | |
|---|---|---|---|
| 7,300,858 | B2 | 11/2007 | Im |
| 7,473,494 | B2 * | 1/2009 | Ozawa ................ G03F 1/50 355/53 |
| 7,476,475 | B2 * | 1/2009 | Park ................ C30B 13/24 257/E21.134 |
| 8,999,865 | B2 * | 4/2015 | Mizumura .......... H01L 21/0268 438/798 |
| 9,087,696 | B2 * | 7/2015 | Im ................ B23K 26/083 |
| 9,646,831 | B2 * | 5/2017 | Im ................ B23K 26/083 |
| 10,312,351 | B2 | 6/2019 | Mizumura |
| 2002/0104750 | A1 | 8/2002 | Ito |
| 2005/0032385 | A1 | 2/2005 | Ito |
| 2006/0060130 | A1 | 3/2006 | Im |
| 2018/0040718 | A1 | 2/2018 | Mizumura |
| 2019/0157462 | A1 * | 5/2019 | Mizumura ........ H01L 29/78618 |
| 2019/0267235 | A1 * | 8/2019 | Mizumura ........ H01L 21/02422 |
| 2020/0303193 | A1 * | 9/2020 | Nakagawa ............ H01L 21/268 |

FOREIGN PATENT DOCUMENTS

| | | | |
|---|---|---|---|
| JP | 5470519 | B2 | 4/2014 |
| WO | 2016/186043 | A1 | 11/2016 |

\* cited by examiner

LASER ANNEALING APPARATUS, LASER ANNEALING METHOD, AND MASK

TECHNICAL FIELD

The present invention relates to a laser annealing apparatus, a laser annealing method, and a mask.

BACKGROUND ART

A liquid-crystal display of thin film transistor (TFT) type has a configuration in which a TFT substrate and a color filter substrate having colors of red (R), green (G), and blue (B) are bonded together with a specific space therebetween and liquid-crystal is injected in the space between the TFT substrate and the color filter substrate, thereby enabling display of a video under control of light transmittance of liquid crystal molecules on a pixel-by-pixel basis.

Data lines and scan lines are wired in a lattice manner in vertical and transverse directions on the TFT substrate, and pixels are provided at respective intersections of the data lines and the scan lines. The pixels each include a pixel electrode, a counter electrode, and a liquid crystal layer located between the pixel electrode and the counter electrode. A drive circuit for driving the data lines and the scan lines that is constituted by TFTs is provided in the vicinity of a display region constituted by the plurality of pixels.

For the TFTs, various TFTs are developed such as an amorphous silicon (amorphous, a-Si) TFT using a silicon semiconductor, a low-temperature polysilicon TFT including a semiconductor layer made of polysilicon (polycrystalline, p-Si). The a-Si TFT has high resistance and small leak current (leakage current). By contrast, the p-Si TFT has significantly larger electron mobility than the a-Si TFT.

Annealing processing by laser light irradiation can change an amorphous silicon layer to a polysilicon layer. For example, a laser annealing apparatus has been provided by which laser light emitted from a laser light source is shaped into a parallel beam by a lens group and the shaped parallel beam was irradiated on a substrate through a microlens array and a mask through which openings are formed. In a laser annealing apparatus such as above, a specific number of openings are formed through the mask in terms of a scanning direction of the substrate. Through laser light irradiation each time the substrate is moved by a pixel pitch, specific portions (irradiation regions) of the substrate can be irradiated with the laser light scan by times equal to the number of openings through one-cycle (see Patent Literature 1).

CITATION LIST

Patent Literature

Patent Literature 1: Japanese Patent No. 5470519

SUMMARY OF INVENTION

Technical Problem

FIG. 11 is a schematic diagram illustrating a state in which irradiation regions are irradiated with laser light by a conventional laser annealing apparatus. In FIG. 11, a mask is illustrated in an upper part of the drawing and the irradiation regions irradiated with laser light are illustrated in a lower part of the drawing. As illustrated in the upper part of the drawing, the mask has a plurality of openings arranged in a matrix in a scanning direction (also referred to below as a row direction) and a direction perpendicular to the scanning direction (also referred to below as a column direction). For example, laser light is irradiated while the mask is moved in the scanning direction. As such, as illustrated in the lower part of the drawing, an amount of laser light irradiation differs column by column in the irradiation regions of the substrate. This causes variation in crystal state between columns to involve variation in for example electron mobility, resulting in recognition of the variation in electron mobility as non-uniform scanning.

FIG. 12 is a schematic illustration explaining a cause of variation in crystal state which arises in a conventional laser annealing apparatus. In FIG. 12, a mask is supposed to have openings arranged in a matrix of two rows and one column for the sake of simplicity. FIG. 12 schematically illustrates a state in which the mask moves in the scanning direction as elapse of time (time t1, t2, t3, and t4). Specific parts (S1, S2, and S3) of a substrate surface on which a silicon film is formed are irradiated with laser light. Attention is focused on irradiation regions S1 to S3. The irradiation region S1 is irradiated with laser light at time t1 and time t2. Likewise, the irradiation region S2 is irradiated with laser light at time t2 and time t3, and the irradiation region S3 is irradiated with laser light at time t3 and time t4. The amount of laser light irradiation may vary each time irradiation is performed. This causes dispersion in amount of irradiation per time to cause variation in mobility among the irradiation regions S1 to S3 (that is, irradiation regions in each column) to cause non-uniform scanning.

The present invention has been made in view of the foregoing and has its object of providing a laser annealing apparatus, a laser annealing method, and a mask included in the laser annealing apparatus by which non-uniform scanning can be reduced.

Solution to Problem

A laser annealing apparatus according to an embodiment of the present invention includes a mask having a plurality of openings arranged in a matrix of rows and columns. The rows extend in a row direction parallel to a scanning direction. The columns extend in a column direction perpendicular to the scanning direction. The laser annealing apparatus moves at least one of the mask and a substrate in a direction parallel to the scanning direction, and irradiates a plurality of specific regions of the substrate with laser light through the openings. All or some of the openings are configured such that partial regions included in the specific regions are irradiated with the laser light. The openings are configured such that: between a specific region of the specific regions irradiated with the laser light through openings of one opening group lying in the row direction and another specific region of the specific regions irradiated with the laser light through openings of another row opening group lying in the row direction, a number of times of laser light irradiation on partial regions that occupy congruent parts of the respective specific regions is equal; and at least two openings of at least one of opening groups lying in the column direction differ from each other in position or shape.

A laser annealing method according to an embodiment of the present invention is a laser annealing method implemented through use of the laser annealing apparatus according to the embodiment of the present invention, and includes moving at least one of the substrate and the mask in the direction parallel to the scanning direction; and irradiating the substrate with the laser light through the openings.

A mask according to an embodiment of the present invention is a mask having a plurality of openings that are arranged in a matrix of rows and columns and through which a plurality of specific regions of a substrate are irradiated with laser light. The rows extend in a row direction parallel to a scanning direction. The columns extend in a column direction perpendicular to the scanning direction. All or some of the openings are configured such that partial regions included in the specific regions are irradiated with the laser light. The openings are configured such that: between a specific region of the specific regions irradiated with the laser light through openings of one row opening group lying in the row direction and another specific region of the specific regions irradiated with the laser light through openings of another row opening group lying in the row direction, a number of times of laser light irradiation on partial regions that occupy congruent parts of the respective specific regions is equal; and at least two openings of at least one of opening groups lying in the column direction differ from each other in position or shape.

Advantageous Effects of Invention

According to the present invention, non-uniform scanning can be reduced.

DESCRIPTION OF EMBODIMENTS

Figure 1:
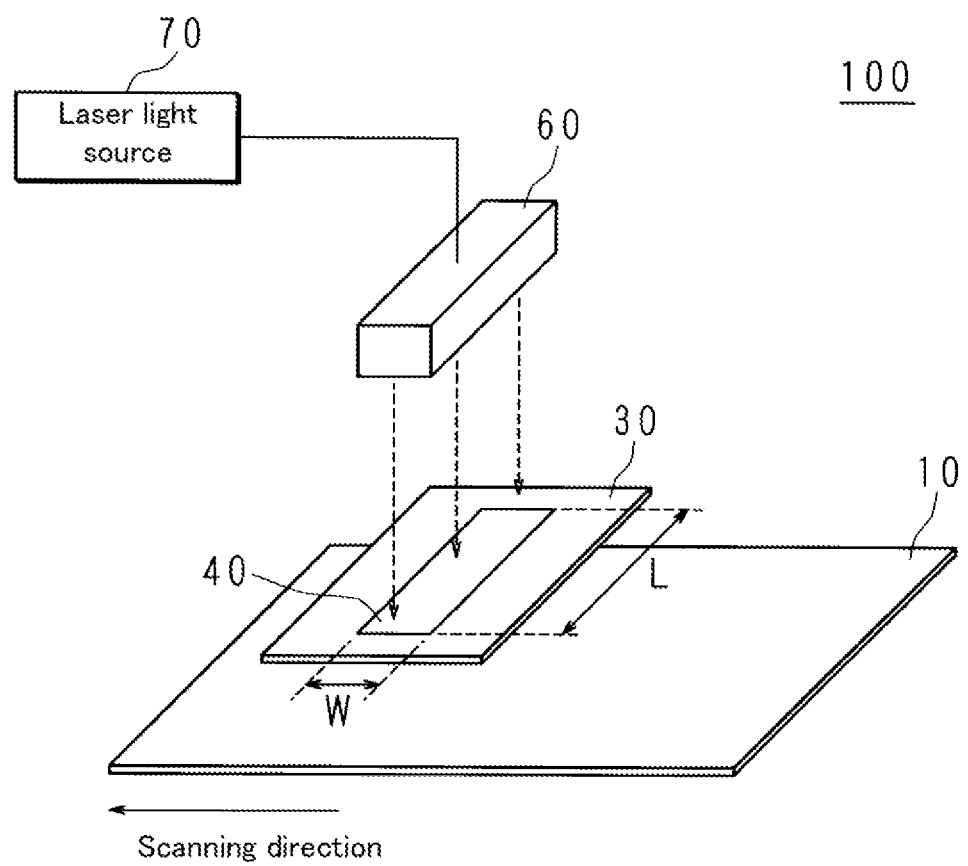
FIG. 1 is a schematic diagram illustrating an example of a configuration of a laser annealing apparatus according to an embodiment.

An embodiment of the present invention will be described in detail below with reference to the accompanying drawings. FIG. 1 is a schematic diagram illustrating an example of a configuration of a laser annealing apparatus 100 according to the present embodiment. The laser annealing apparatus 100 according to the present embodiment includes a laser light source 70, an optical system 60, a mask (light shielding plate) 30, and the like. The laser light source 70 emits laser light. The optical system 60 includes a lens group for shaping the laser light emitted from the laser light source 70 into parallel beams. The mask 30 includes a mask portion 40 in which later-described openings and microlenses are arranged in arrays. Specific parts of a substrate 10 are partially irradiated with the parallel beams shaped by the optical system 60 through the openings and the microlens of the mask portion 40. The substrate 10 is conveyed at a constant speed by a non-illustrated drive mechanism. The laser light source 70 performs laser light irradiation each time an irradiation position of the substrate 10 reaches a position corresponding to the openings. Note that the laser annealing apparatus 100 may have a configuration in which the mask 30 is moved while the substrate 10 is fixed instead of the above configuration in which the substrate 10 is moved. The following describes an example in which the substrate 10 is moved.

Figure 2:
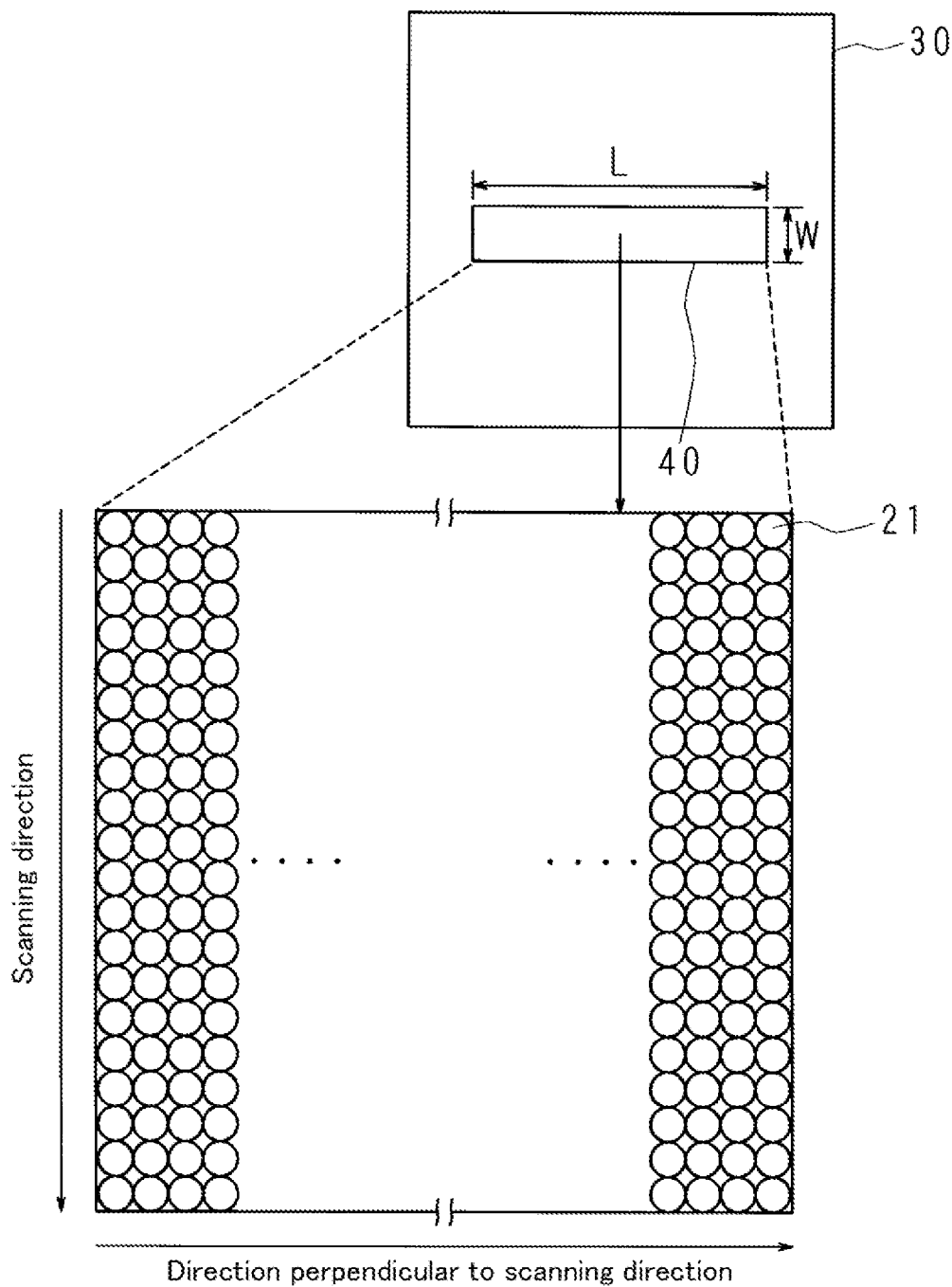
FIG. 2 is a schematic plan view of an example of a configuration of a mask according to the embodiment.

FIG. 2 is a schematic plan view of an example of a configuration of the mask 30 according to the present embodiment. The mask 30 has the mask portion 40 which is rectangular in shape. A dimension of the mask portion 40 in a direction parallel to a scanning direction (also referred to below as a row direction) is referred to as a dimension W, and a dimension thereof in a direction perpendicular to the scanning direction (also referred to below as a column direction) is referred to as a dimension L. The microlenses 21 are arranged in arrays at regular intervals in the direction parallel to the scanning direction and the direction perpendicular to the scanning direction in the mask portion 40.

The dimension W of the mask portion 40 in the row direction may be for example approximately 5 mm, and the dimension L in the column direction may be approximately 37 mm. However, these dimensions are not limited to being such values. A predetermined number (20 in the example illustrated in FIG. 2) of microlenses 21 are arranged at regular intervals in the direction parallel to the scanning direction (row direction). The microlenses 21 are in one-to-one correspondence with the openings. Accordingly, 20 openings are formed at regular intervals in the direction parallel to the scanning direction (row direction) in the mask 30.

Figure 3:
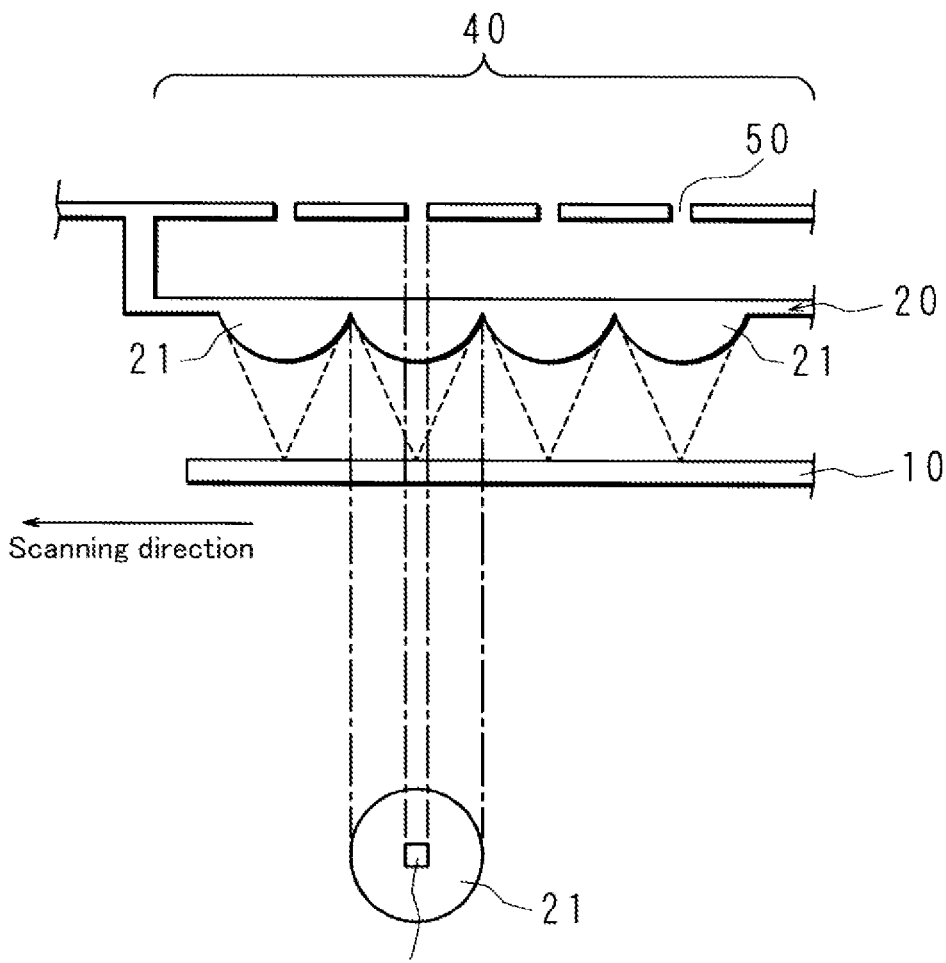
FIG. 3 is a schematic diagram illustrating a positional relationship between openings and microlenses in the embodiment.

FIG. 3 is a schematic diagram illustrating a positional relationship between the openings 50 and the microlenses 21 in the present embodiment. FIG. 3 illustrates the positional relationship between the openings 50 and the microlenses 21 as viewed from front and illustrates the position of one of the openings 50 relative to the position of a corresponding one of the microlens 21 as a reference as viewed in plan. As illustrated in FIG. 3, the mask portion 40 includes the plurality of openings 50 and the microlenses (lenses) 21. Note that the microlenses 21 are formed on a transparent substrate 20 in correspondence with the openings 50 and the transparent substrate 20 is integral with the mask 30. Furthermore, the openings 50 are located such that the center of each microlens 21 in a circular shape when viewed in plan coincides with the center of a corresponding one of the rectangular openings 50. The mask 30 is spaced apart at an appropriate distance from incident surfaces of the microlenses 21. Each of the microlenses 21 may have a maximum size (a diameter of a circle when viewed in plan) of for example 150 μm to 400 μm. However, the maximum size is not limited to these values. The microlenses 21 may be also called microlens arrays.

When irradiation of the parallel beams shaped by the aforementioned optical system 60 is performed through the openings 50 in the mask portion 40, the laser light having passed through the openings 50 are condensed by the microlenses 21 and specific parts of the substrate 10 corresponding to the respective openings 50 (that is, the microlenses 21) are partially irradiated with the condensed laser light.

Figure 4A:
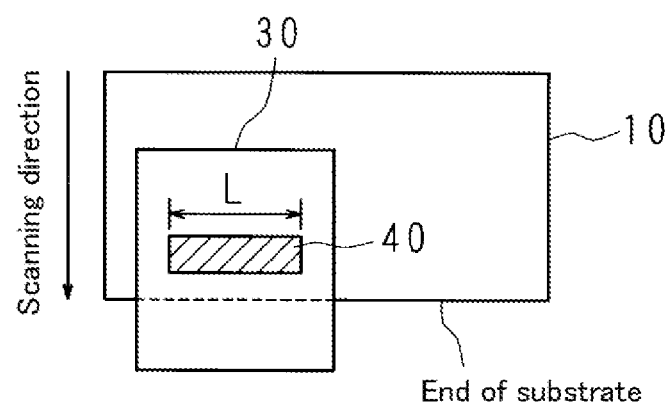
FIG. 4A is a schematic diagram illustrating an example of scanning performed on a substrate by the laser annealing apparatus according to the embodiment.
Figure 4B:
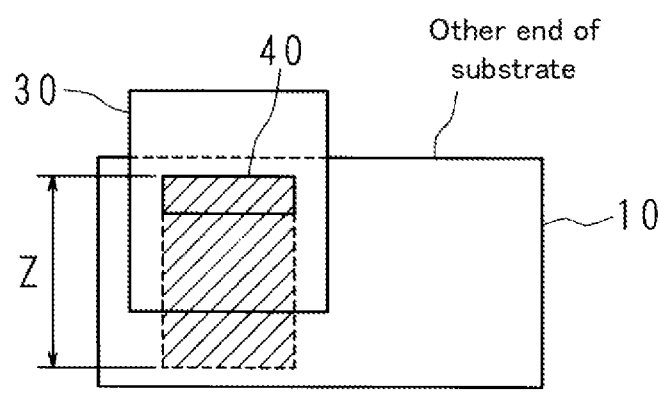
FIG. 4B is a schematic diagram illustrating an example of scanning performed on the substrate by the laser annealing apparatus according to the embodiment.
Figure 4C:
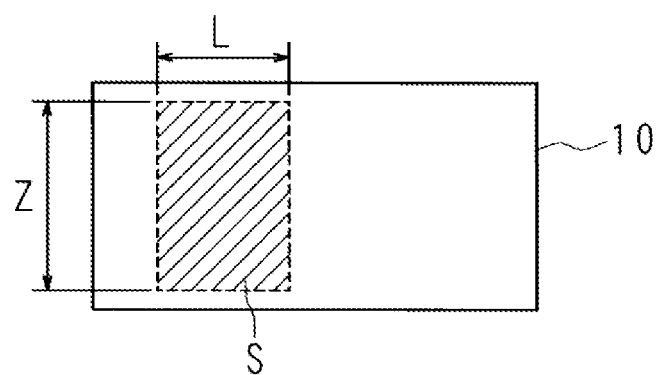
FIG. 4C is a schematic diagram illustrating an example of scanning performed on the substrate by the laser annealing apparatus according to the embodiment.

FIGS. 4A, 4B, and 4C are schematic diagrams each illustrating an example of scanning performed on the substrate 10 by the laser annealing apparatus 100 according to the present embodiment. FIG. 4A illustrates a state in which the mask 30 is set at a specific location before the substrate 10 is moved in the scanning direction. The laser annealing apparatus 100 moves the substrate 10 in the scanning direction at a constant speed from the state illustrated in FIG. 4A. The laser light source 70 performs laser light irradiation each time an irradiation position of the substrate 10 reaches a position corresponding to the openings 50. For example, in the case of the openings 50 illustrated in FIG. 2, laser light irradiation is performed 20 times on the same location (irradiation region) of the substrate 10. FIG. 4B illustrates a state in which the substrate 10 is moved at the constant speed to a final position in the scanning direction (by a distance Z). As illustrated in FIG. 4C, the specific parts within a region in a specific irradiation range S of the substrate 10 can be partially irradiated with the laser light by moving the substrate 10 to the position illustrated in FIG. 4B. When the mask 30 in the state illustrated in FIG. 4C is moved by the dimension L in the direction perpendicular to the scanning direction and then moved in the scanning direction in a manner similar to that illustrated in FIGS. 4A and 4B, the irradiation range S can be increased. Note that although the substrate 10 has almost the same size as the mask 30 in FIGS. 4A to 4C, the substrate 10 is considerably larger in reality than that illustrated in FIGS. 4A to 4C.

Figure 5:
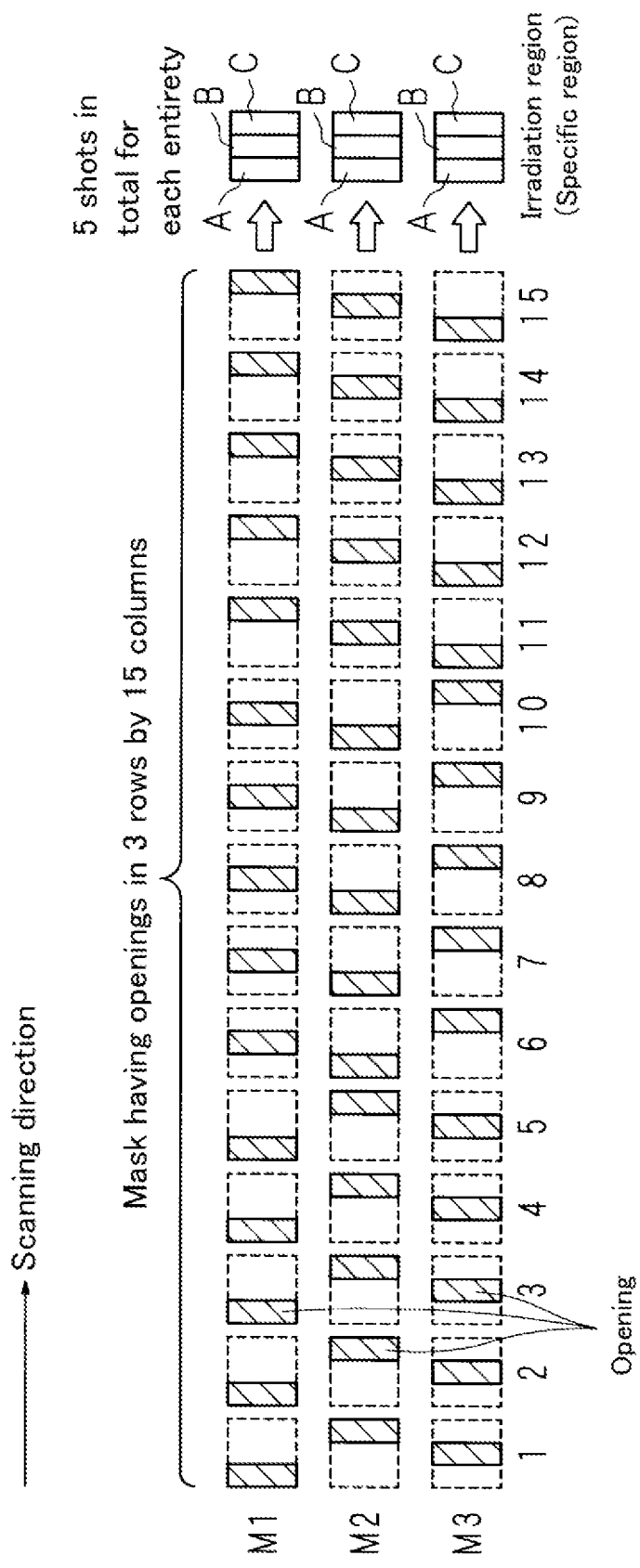
FIG. 5 is a schematic diagram illustrating a first example of the openings in the mask according to the embodiment.

The following describes in detail the mask portion 40 of the mask 30 in the present embodiment. FIG. 5 is a schematic diagram illustrating a first example of the openings in the mask portion 40 according to the present embodiment. In the following description, a mask will be described for the sake of convenience in which the openings are arranged in a matrix of 15 rows by 3 columns in which 15 openings (represented by reference signs 1 to 15) are arranged in the row direction parallel to the scanning direction and 3 openings (represented by reference signs M1 to M3) are arranged in the column direction perpendicular to the scanning direction. In the drawing, three rectangles on the right indicate specific regions (irradiation regions) of the substrate 10 that are irradiated with the laser light through openings of row opening groups (15 openings 1 to 15 in the example in FIG. 5). The specific regions (irradiation regions) each include partial regions A, B, and C. The partial regions A are partial regions that occupy congruent regions in the respective three specific regions. The partial regions B and C are partial regions that occupy congruent regions in the respective three specific regions likewise the partial regions A.

Note that the number of the openings is not limited to 15 in each row and to 3 in each column. Although the openings are illustrated to have a size similar to that of the corresponding irradiation regions (partial regions) in the present embodiment for the sake of convenience, the openings are larger in size than the irradiation regions in reality since the laser light is condensed by the microlenses 21.

As illustrated in FIG. 5, the openings are configured such that the partial regions of the specific regions of the substrate are irradiated with the laser light. That is, the one partial region, which is a part of the specific region, is irradiated with the laser light through the opening. All the openings arranged in the matrix may be configured such that the partial regions of the specific regions are irradiated with the laser light as illustrated in FIG. 5. Alternatively, some of the openings arranged in the matrix may be configured such that the partial regions of the specific regions are irradiated with the laser light.

The openings arranged in the matrix are configured such that between a specific region irradiated with the laser light through openings of one of the row opening groups lying in the row direction and a specific region irradiated with the laser light through openings of another one of the row opening groups lying in the row direction, the number of times of laser light irradiation on partial regions that occupy congruent parts of the respective specific regions is equal. In FIG. 5, when the one of the rows is represented by M1, the other rows can be represented by M2 and M3.

Suppose for example that each specific region includes the three partial regions A, B, and C and the number of times of irradiation on each specific region is represented by N as illustrated in FIG. 5, the number of times of irradiation on each of the partial regions A, B, and C is N. That is, the three partial regions A, B, and C are each irradiated with the laser light by N times through openings of one of the row opening groups. Likewise, the three partial regions A, B, and C are each irradiated with the laser light by N times through openings of each of the other row opening group. Thus, the irradiation regions of the substrate in the column direction can be each irradiated by equal N times with the laser light.

Furthermore, the openings arranged in the matrix are configured such that location or shape of at least two openings of each of column opening groups lying in the column direction differs from each other.

The openings arranged in the column direction are the same as one another in shape and size in conventional laser annealing apparatuses. Therefore, dispersion in amount of irradiation between irradiation regions in different columns is more significant than that in amount of irradiation between irradiation regions in the column direction, which serves as a cause of non-uniform scanning.

At least two opening of each column opening group lying in the column direction differ from each other in either position or shape in the present embodiment. This can proximate dispersion in amount of irradiation between irradiation regions in the column direction to dispersion in amount of irradiation between irradiation regions in different columns, with a result that non-uniform scanning can be reduced.

More specific description will be made using an example illustrated in FIG. 5. The row opening groups lying in the row direction will be described first. When attention is focused on the row M1 in FIG. 5, the partial region A, among the partial region A located left, the partial region B located at the center, and the partial region C located right, of a specific region is irradiated 5 times (shots) through corresponding openings in the columns 1 to 5. Also, the partial region B located at the center is irradiated 5 times (shots) through corresponding openings in the columns 6 to 10. Likewise, the partial region C located right is irradiated 5 times (shots) through corresponding openings in the columns 11 to 15. Thus, the specific region is irradiated 5 times as a whole.

Similarly, when attention is focused on the row M2 in FIG. 5, the partial region C located right, among the partial region A located left, the partial region B located at the center, and the partial region C located right, of a specific region is irradiated 5 times (shots) through corresponding openings in the columns 1 to 5. Also, the partial region A located left is irradiated 5 times (shots) through corresponding openings in the columns 6 to 10. Likewise, the partial region B located at the center is irradiated 5 times (shots) through corresponding openings in the columns 11 to 15. Thus, the specific region is irradiated 5 times as a whole. The same is applied to the row M3. In the above configuration, each of the irradiation regions of the substrate in the column direction can be each irradiated by 5 times with the laser light.

Next, the column opening groups lying in the column direction will be described. When attention is focused on the column 1 in FIG. 5, irradiation is performed (shot) on the partial region A located left of a specific region through a corresponding opening in the row M1. Irradiation is performed on the partial region C located right of a specific region through a corresponding opening in the row M2. Irradiation is performed on the partial region B located at the center of a specific region through a corresponding opening in the row M3. The same is applied to the columns 2 to 5. The positions of the openings in the column direction differ from one another as described above to enable laser light irradiation on different partial regions of the respective specific regions arranged in the column direction at the same time.

When attention is focused on the column 6 in FIG. 5 in a similar manner, irradiation is performed (shot) on the partial region B located at the center of a specific region through a corresponding opening in the row M1. Irradiation is performed on the partial region A located left of a specific region through a corresponding opening in the row M2. Irradiation is performed on the partial region C located right in a specific region through a corresponding opening in the row M3. The same is applied to the columns 7 to 10. As described above, differentiation in position of the openings arranged in the column direction can enable laser light irradiation on different partial regions of specific regions arranged in the column direction at the same time. The same is applied to the openings in the columns 11 to 15. Differentiation in position of the openings arranged in the column direction can approximate dispersion in amount of irradiation between the irradiation regions in the column direction to dispersion in amount of irradiation between the irradiation regions in different columns, with a result that non-uniform scanning can be reduced.

At least two openings of each column opening group lying in the column direction differ from each other in position in the row direction. In the example illustrated in FIG. 5, for example, the opening in the row M1 and the opening in the row M2 among the openings in the column 1 differ from each other in position in the direction parallel to the scanning direction (row direction). The same is applied to the positional relationship between the opening in the row M1 and the opening in the row M3, and the same is applied to the positional relationship between the opening in the row M2 and the opening in the row M3.

In the above configuration, the positions of the partial regions irradiated with the laser light at the same time can differ from one another in the irradiation regions in the column direction. In other words, the positions can be changed in the row direction (the direction parallel to the scanning direction) in the example of FIG. 5. Thus, the amounts of irradiation in the irradiation regions in the column direction can be dispersed, with a result that non-uniform scanning can be reduced.

Figure 6:
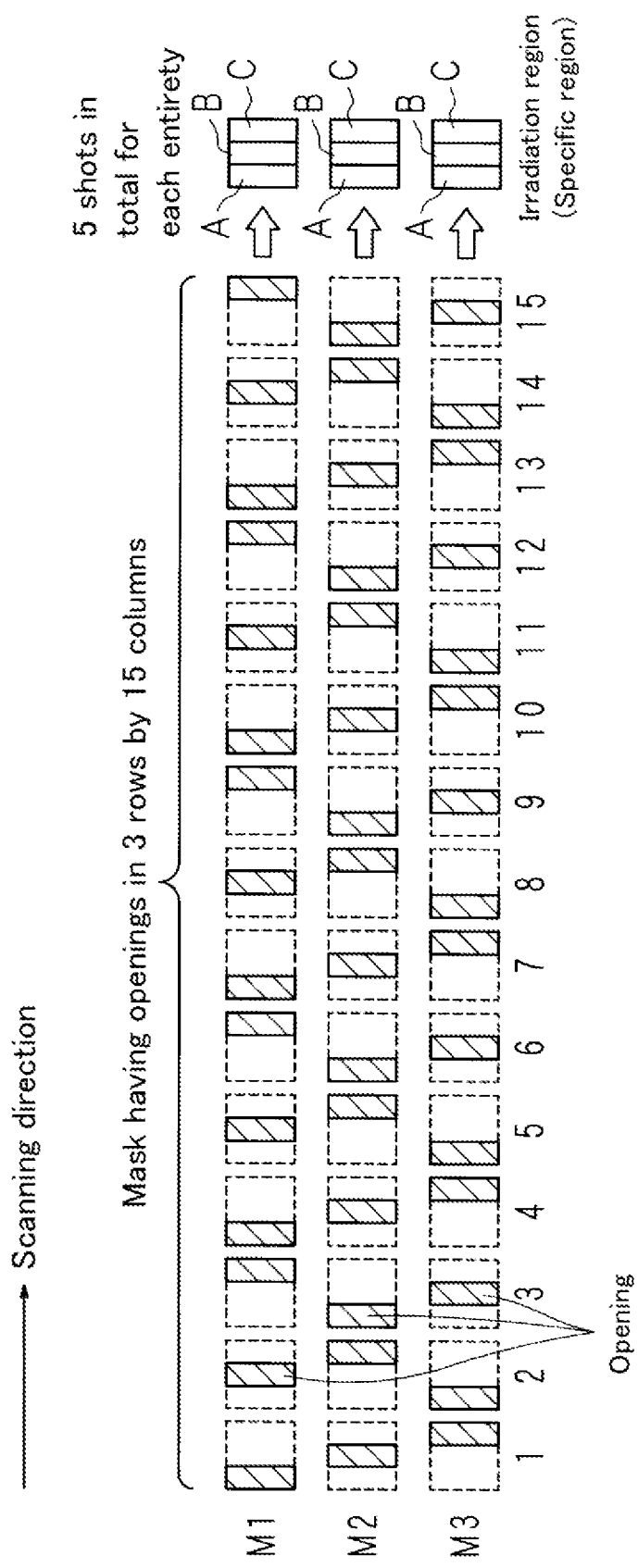
FIG. 6 is a schematic diagram illustrating a second example of the openings in the mask according to the embodiment.

FIG. 6 is a schematic diagram illustrating a second example of the openings in the mask portion 40 according to the present embodiment. In the second example illustrated in FIG. 6, arrangement order of the openings is different from that in the first example illustrated in FIG. 5. When attention is focused on the column 1 in FIG. 6, irradiation is performed (shot) on the partial region A located left of the specific region through the corresponding opening in the row M1. Irradiation is performed on the partial region B located at the center of the specific region through the corresponding opening in the row M2. Irradiation is performed on the partial region C located right of the specific region through the corresponding opening in the row M3.

Furthermore, when attention is focused on the column 2 in FIG. 6, irradiation is performed on the partial region B located at the center of the specific region through the corresponding opening in the row M1. Irradiation is performed on the partial region C located right of the specific region through the corresponding opening in the row M2. Irradiation is performed on the partial regions A located left of the specific region through the corresponding opening in the row M3.

In the second example illustrated in FIG. 6, laser light irradiation can be performed on each of the irradiation regions of the substrate in the column direction by the same 5 times likewise in the first embodiment. Differentiation in position of the openings arranged in the column direction can approximate dispersion in amount of irradiation between the irradiation regions in the column direction to dispersion in amount of irradiation between the irradiation regions in different columns, with a result that non-uniform scanning can be reduced.

Moreover, the positions of the partial regions irradiated with the laser light at the same time can be changed in the row direction among the irradiation regions in the column direction (that is, the direction parallel to the scanning direction). Thus, amounts of irradiation can be dispersed among the irradiation regions in the column direction, with a result that non-uniform scanning can be reduced.

Figure 7:
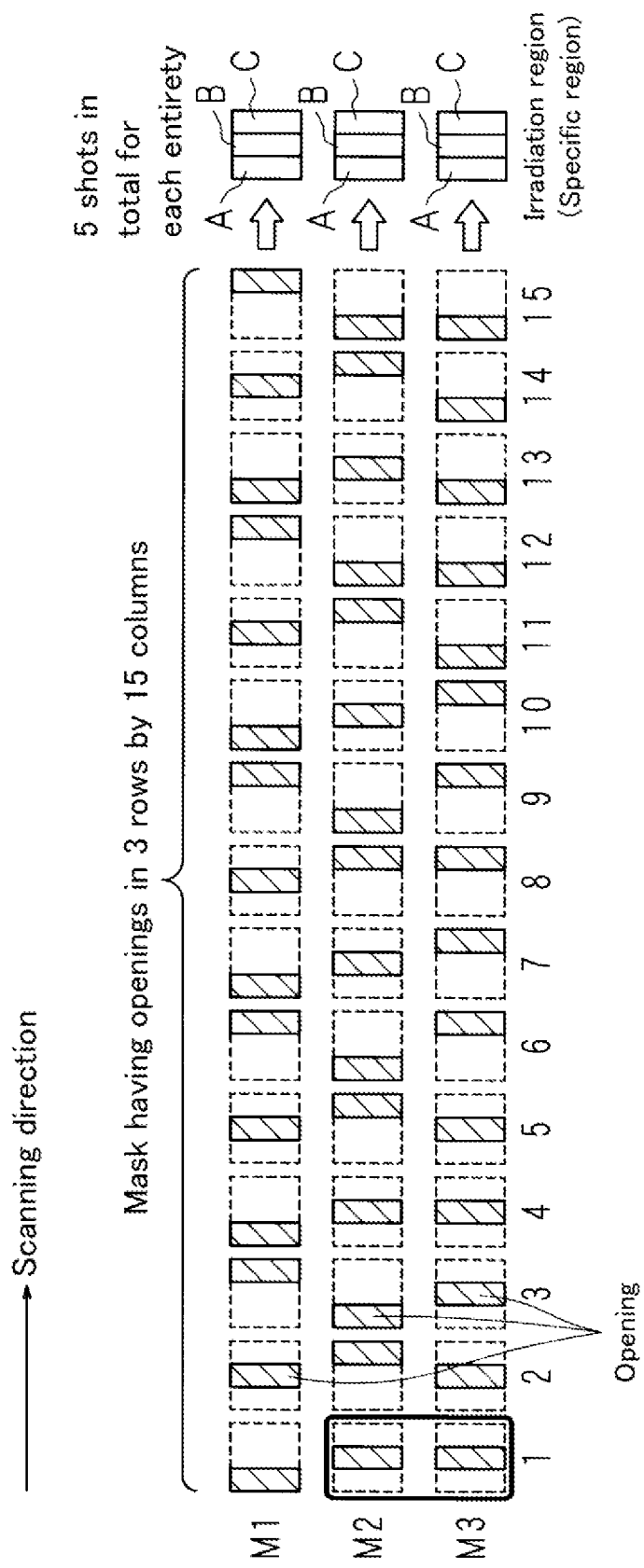
FIG. 7 is a schematic diagram illustrating a third example of the openings in the mask according to the embodiment.

FIG. 7 is a schematic diagram illustrating a third example of the openings in the mask portion 40 according to the present embodiment. The positions of all of the openings arranged in the column direction are changed in the direction parallel to the scanning direction (row direction) in the first examples and the second example as described above. However, the present invention is not limited to the above. Any two or more of the openings of each column opening group lying in the column direction may be the same as each other in position and shape. For example, as illustrated in FIG. 7, the positions of some of the openings of any of the column opening groups lying in the column direction may not be changed in the direction parallel to the scanning direction (row direction). When attention is focused on the openings in the column 1 in FIG. 7, the opening in the row M2 and the opening in the row M3 do not differ from each other in position in the direction parallel to the scanning direction (row direction) (as surrounded by a bold line). The same is applied to the columns 2, 4 to 6, 8, 9, 12, 13, and 15. According to the third example illustrated in FIG. 7, the same operation and effects are exerted as in the first example and the second example.

Figure 8:
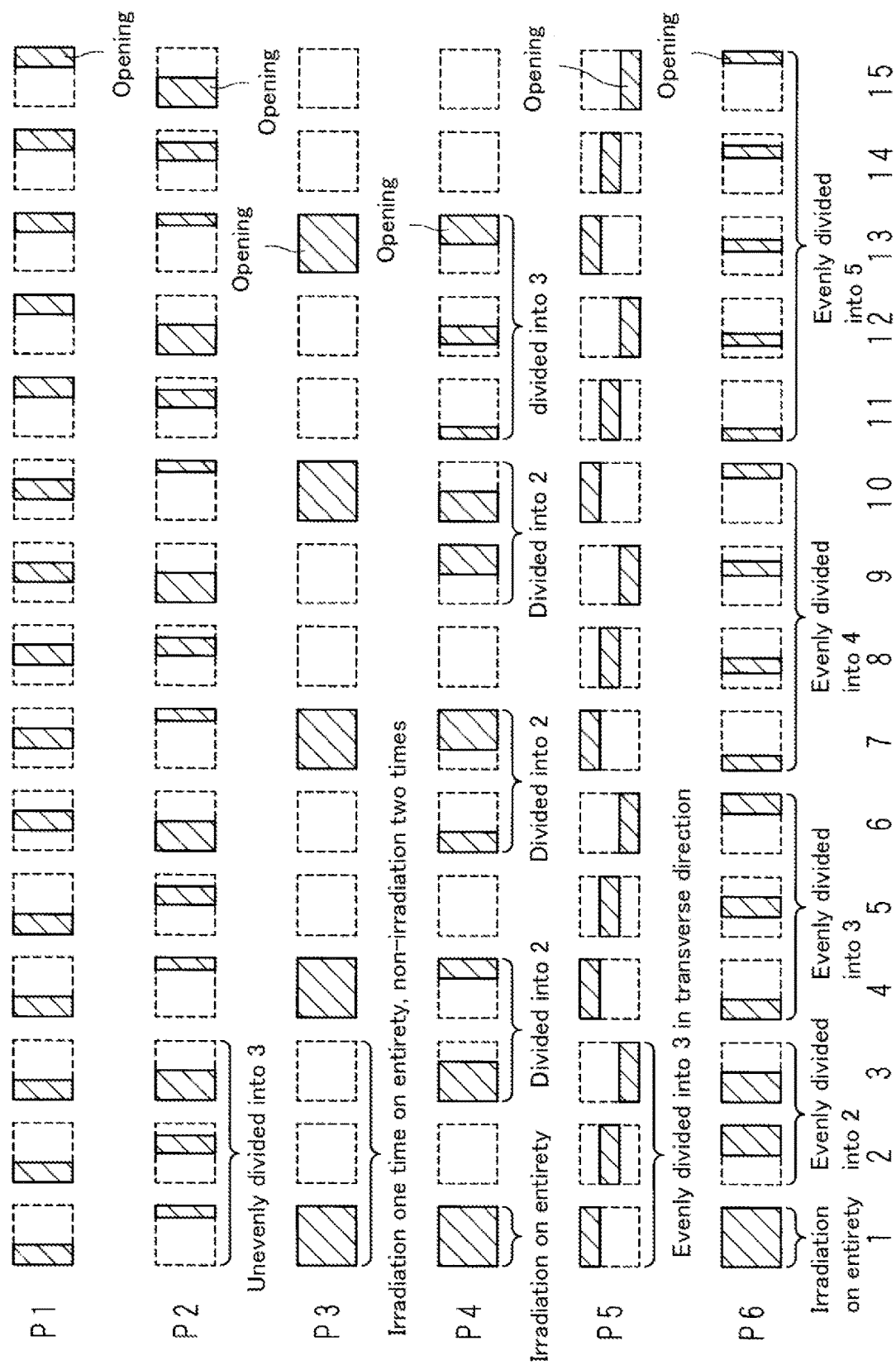
FIG. 8 is a schematic diagram illustrating another example of opening groups of the mask lying in a row direction according to the embodiment.

FIG. 8 is a schematic diagram illustrating the row opening groups in the mask portion 40 arranged in the row direction according to another example of the present embodiment. FIG. 8 illustrates an example in which six opening groups, which are represented by reference signs P1 to P6, extend in the row direction. Reference sign P1 represents the same opening group as that in the row M1 in FIG. 5. Furthermore, the opening groups lying in the row direction in FIGS. 5 to 7 are those of which the arrangement order is changed from that of the opening group represented by reference sign P1.

A configuration in which the openings are arranged in 3 rows by 15 columns as described in the examples illustrated in FIGS. 5 to 7 can employ a combination of opening groups in any three rows of the opening groups 1P to P6 (for example, a combination of P1, P2, and P3, a combination of P3, P4, and P5, or a combination of P1, P4, and P6).

As illustrated in FIG. 8, the opening group represented by reference sign P2 includes openings having different sizes (openings having different shapes). Although a partial region is not a region evenly divided into three in each specific region irradiated with the laser light through a corresponding one of the openings of the opening group represented by P2, irradiation is performed on each of the partial regions 5 times. That is, the number of times of laser light irradiation through the openings of the opening group represented by reference sign P2 on the corresponding specific regions is 5.

The opening group represented by reference sign P3 includes openings through which the entireties of corresponding specific regions are irradiated and openings through which the entireties of corresponding specific regions are not irradiated (that is, non-open openings). The number of times of laser light irradiation through the openings of the opening group represented by reference sign P3 on the corresponding specific regions is 5.

The opening group represented by reference sign P4 includes an opening through which the entireties of corresponding specific regions are irradiated, openings through which corresponding specific regions each divided into two (unevenly divided) are irradiated, and opening through which corresponding specific regions divided into three (unevenly divided) are irradiated. The number of times of laser light irradiation through the openings of the opening group represented by reference sign P4 on the corresponding specific regions is 5.

As for the openings of the opening group represented by reference sign P5, each of corresponding specific regions are evenly divided into three partial regions. In the opening group represented by reference sign P5, the openings differ in position in the column direction between different columns. The number of times of laser light irradiation through the openings of the opening group represented by reference sign P5 on corresponding specific regions is 5. That is, the number of times of laser light irradiation through the openings of the opening group represented by reference sign P5 on the corresponding specific regions is 5.

The opening group represented by reference sign P6 includes an opening through which the entirety of a corresponding specific region is irradiated and openings through which partial regions of corresponding specific regions divided into two to five are irradiated. The number of times of laser light irradiation through the openings of the opening group represented by reference sign P6 on the corresponding specific regions is 5.

As illustrated in the example in FIG. 8, at least two openings of openings arranged in the column direction can differ from each other in shape. In the above configuration, the partial regions irradiated with the laser light at the same time in the irradiation regions arranged in the column direction can differ from one another in shape to disperse the amount of irradiation among the irradiation regions in the column direction, resulting in reduction in non-uniform scanning.

Furthermore, as illustrated in the example in FIG. 8, it is possible that the opening groups lying in the row direction (any of the opening groups represented by reference signs P1 to P6 in the example in FIG. 8) may each include a combination of openings of which positions are changed in the row direction (for example, reference signs P1, P2, and P6).

Furthermore, the openings of each opening group lying in the row direction may be a combination of openings of which positions are changed in the column direction (for example, reference sign P5).

The openings of each opening group lying in the row direction may be a combination of openings including at least an opening through which the entirety of a corresponding specific region can be irradiated with the laser light and a non-open opening that blocks the laser light (for example, reference signs P3 and P4).

Though the opening groups different in combination of openings as described above being arranged in the column direction (for example, a combination of P1, P2, and P3, a combination of P3, P4, and P5, or a combination of P1, P4, and P6), the specific regions as wholes can be equalized in the number of times of laser light irradiation and the positions of the partial regions which occupy the specific regions can be changed as appropriate, resulting in reduction in non-uniform scanning.

The number of times of laser light irradiation in the examples of the openings in the mask portion illustrated in FIGS. 5 to 8 as described above is the same in each specific region as a whole (for example, 5 times). However, the present invention is not limited to the above. The number of times of irradiation may differ between at least two partial regions of the partial regions constituting the specific region.

Figure 9:
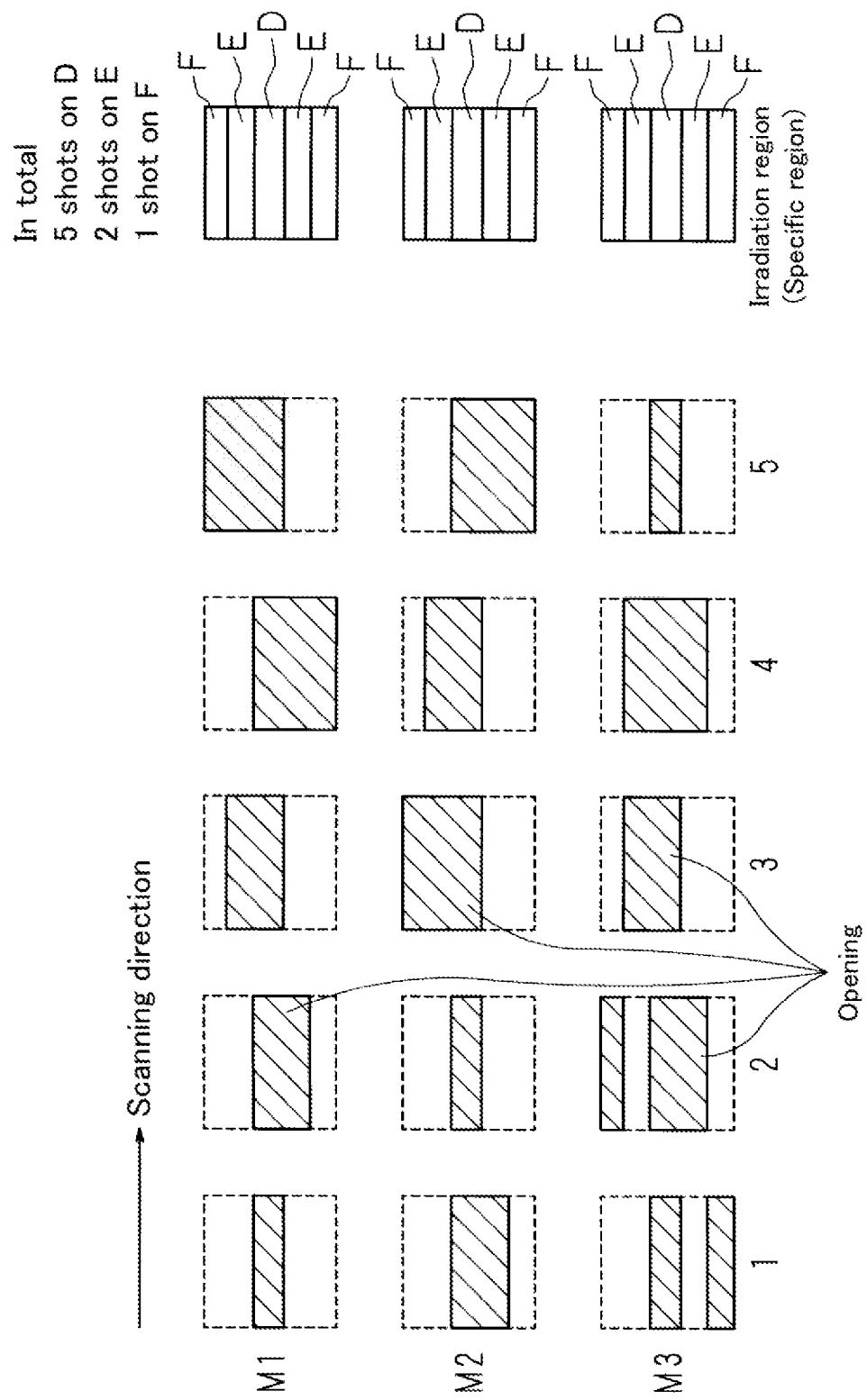
FIG. 9 is a schematic diagram illustrating a fourth example of the openings in the mask according to the embodiment.

FIG. 9 is a schematic diagram illustrating a fourth example of the openings in the mask portion 40 according to the present embodiment. In the fourth example, right three rectangles indicate specific regions (irradiation regions) of the substrate 10 that are irradiated with the laser light through the openings of each row opening group (5 openings represented by respective reference signs 1 to 5 in the example illustrated in FIG. 9). Each specific region (irradiation region) includes 5 partial regions of a partial region D located at the center of a corresponding specific region, two partial regions E disposed with the partial region D therebetween, and two partial regions disposed with the partial regions E therebetween. The partial regions D are partial regions that occupy congruent regions of the three specific regions. The partial regions E and F are partial regions that occupy respective congruent regions of the three specific regions likewise the partial regions D.

When attention is focused on the row M1 in FIG. 9, irradiation through the openings in the columns 1 to 5 is performed (shot) on the partial regions D of the respective specific regions 5 times, performed (shot) on the partial regions E 2 times, and performed (shot) on the partial regions F one time.

When attention is focused on the row M2, irradiation through the openings in the columns 1 to 5 is performed (shot) on the partial regions D of the respective specific regions 5 times, performed (shot) on the partial regions E 2 times, and performed (shot) on the partial regions F one time.

When attention is focused on the row M3, irradiation through the openings in the columns 1 to 5 is performed (shot) on the partial regions D of the respective specific regions 5 times, performed (shot) on the partial regions E 2 times, and performed (shot) on the partial regions F one time.

As described above, the openings arranged in the matrix are configured such that between respective specific regions irradiated with the laser light through openings of one of the row opening groups lying in the row direction and respective specific regions irradiated with the laser light through openings of another one of the row opening groups lying in the row direction, the number of times of laser light irradiation on partial regions that occupy congruent parts of the respective specific regions is equal. The openings arranged in the column direction differ from one another in position or shape. At least two partial regions of the partial regions constituting the respective specific regions differ from each other in the number of times of irradiation. In the example illustrated in FIG. 9, the partial regions are arranged side by side in the direction perpendicular to the scanning direction, which should not be taken to limit the present invention. The partial regions may be arranged side by side in the direction parallel to the scanning direction.

With the configuration as described above, the amount of laser light irradiation can be differentiated according to the positions of the partial regions of the respective irradiation regions (the specific regions), with a result that characteristics such as electron mobility can be set to desired states.

Figure 10:
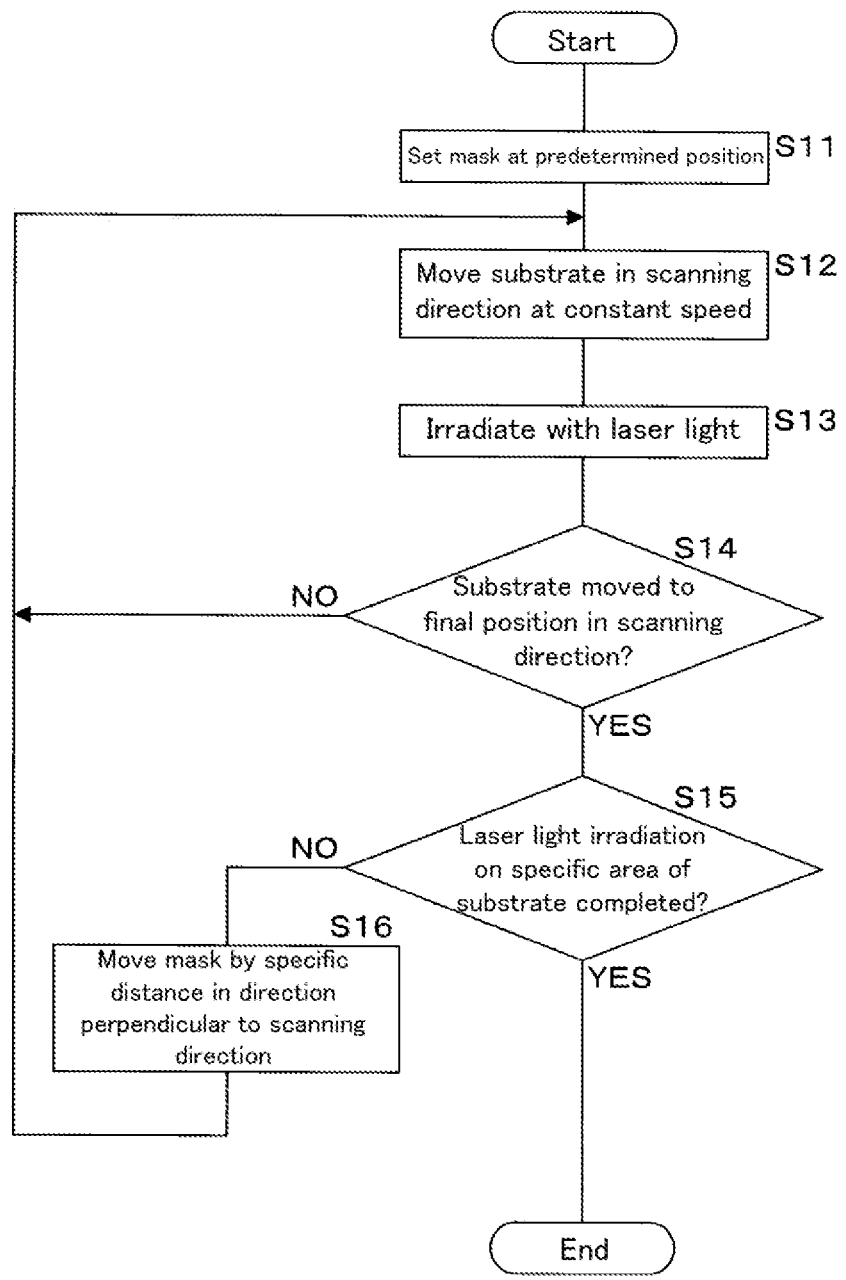
FIG. 10 is a flowchart depicting an example of a laser annealing method implemented by the laser annealing apparatus according to the embodiment.
Figure 11:
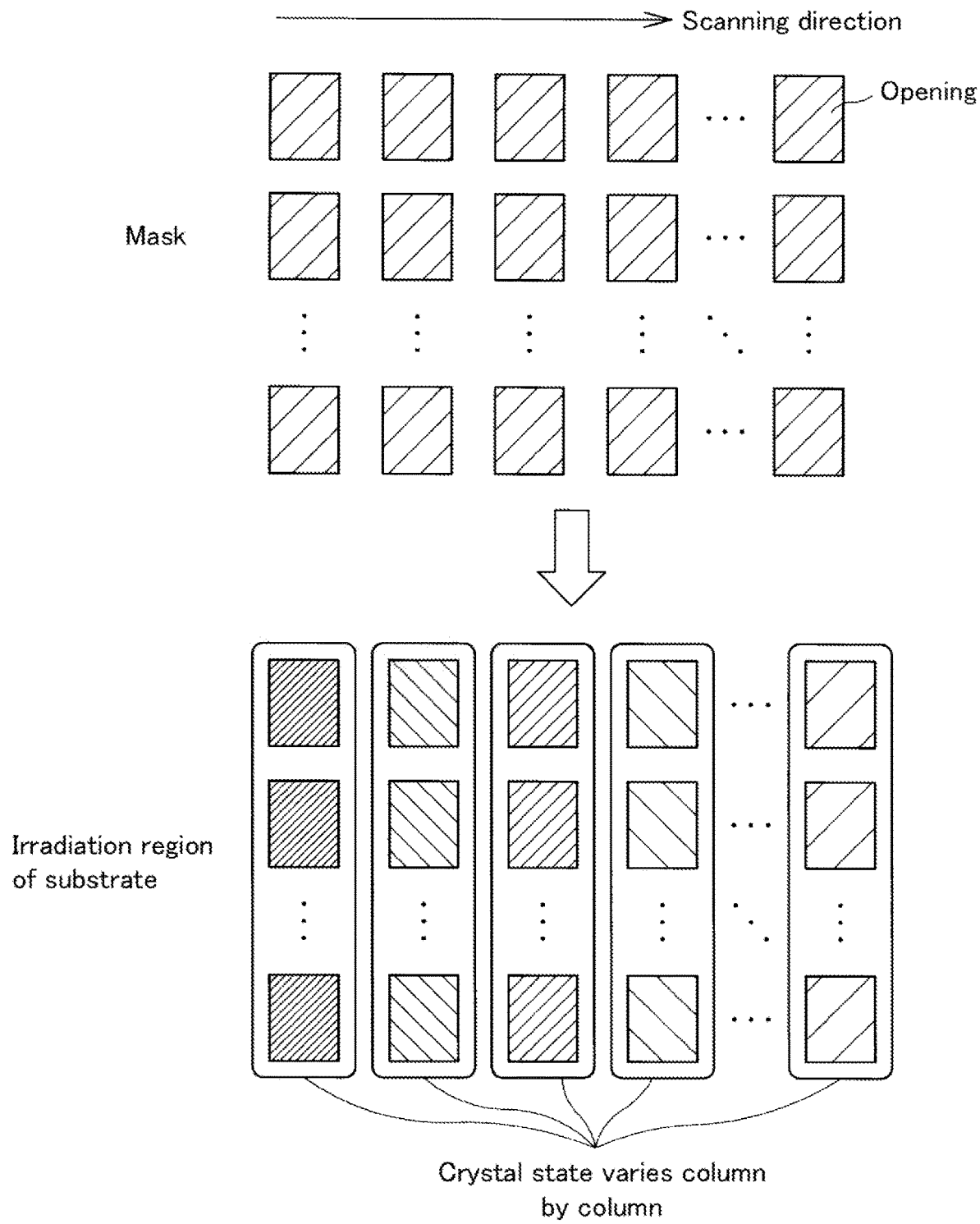
FIG. 11 is a schematic diagram illustrating a state of irradiation regions that are irradiated with laser light by a conventional laser annealing apparatus irradiates.
Figure 12:
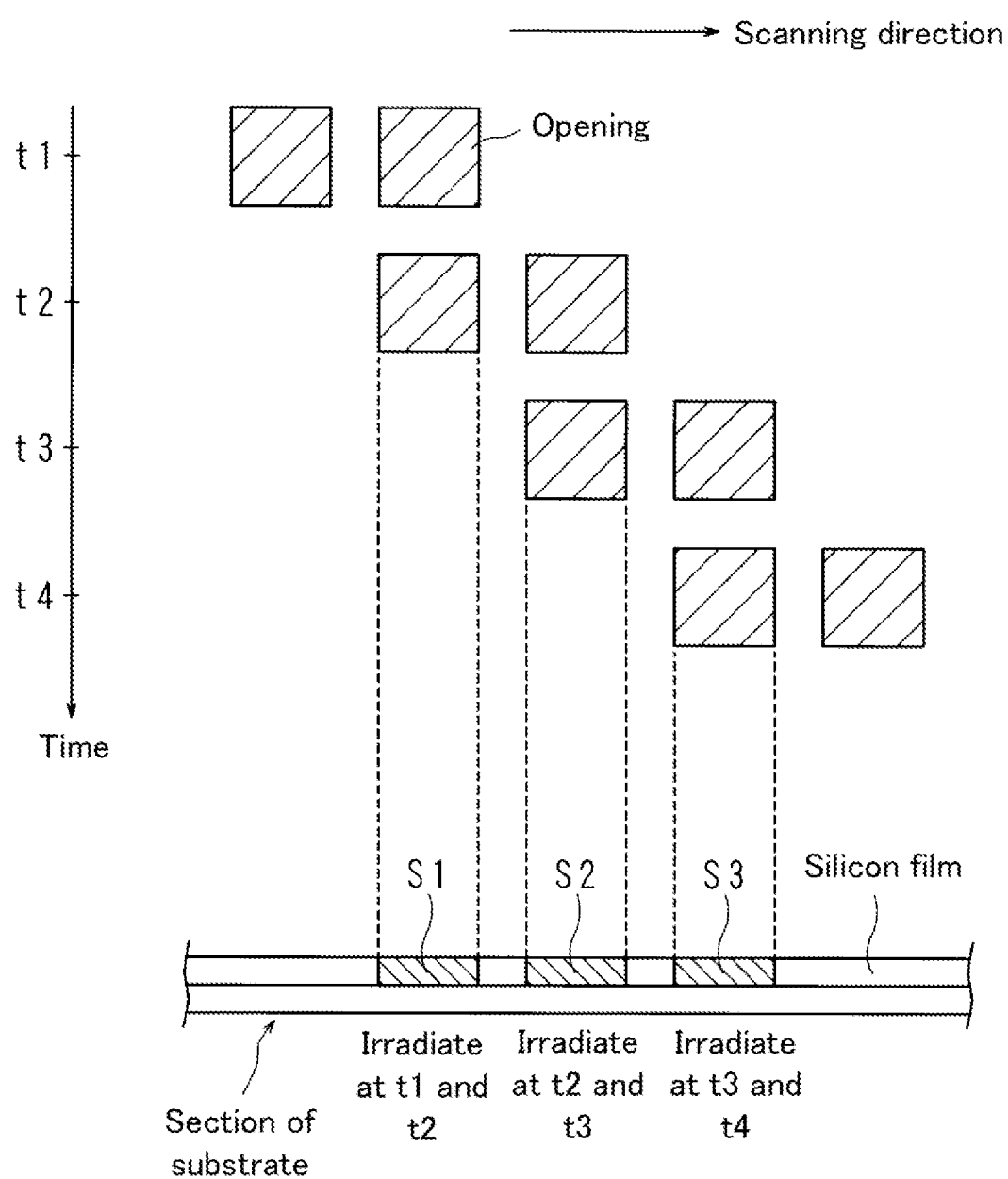
FIG. 12 is a schematic illustration explaining a cause of variation in crystal state which arises in a conventional laser annealing apparatus.

The following describes a laser annealing method implemented through use of the laser annealing apparatus 100 according to the present embodiment. FIG. 10 is a flowchart depicting an example of the laser annealing method implemented through use of the laser annealing apparatus 100 according to the present embodiment. The laser annealing apparatus 100 will be also referred to below as an apparatus 100 for the sake of simplicity. The mask 30 is set at a predetermined position in the apparatus 100 (S11), and the substrate 10 is moved in the scanning direction at a constant speed (S12). The laser light source 70 performs laser light irradiation each time the irradiation positon of the substrate 10 reaches a position corresponding to the openings 50 of the mask 30 (S13).

The apparatus 100 determines whether or not the substrate 10 has been moved to the final position in the scanning direction (S14). When the substrate 10 has not been moved yet to the final position (NO in S14), each processing in Step S12 and steps thereafter is repeated. When the substrate 10 has been moved to the final position in the scanning direction (YES in S14), the apparatus 100 determines whether or not laser light irradiation on a specific area of the substrate has been completed (S15).

When the light irradiation on the specific area of the substrate 10 has not been completed yet (NO in S15), the apparatus 100 moves the mask 30 by a specific distance (dimension L in a transverse direction of the mask 30) in the direction perpendicular to the scanning direction (S16), and each processing in Step S12 and steps thereafter is repeated. Note that the substrate 10 may be moved instead of the mask 30 in the processing in Step S16. When the light irradiation on the specific area of the substrate 10 has been completed (YES in S15), the apparatus 100 terminates the process. Note that the substrate 10 is moved (conveyed) in the scanning direction in the example illustrated in FIG. 10, which should not be taken to limit the present invention. The mask 30 (including the optical system 60 if necessary) may be moved in the scanning direction with the substrate 10 being fixed.

According to the present embodiment, variation in laser finishing which may occur in each scanning can be reduced, achieving reduction in non-uniform scanning.

The above embodiments describe an example in which the openings arranged in a matrix of 3 rows by 15 columns are located in the mask. However, the number of the openings in the mask is not limited to the above number.

In the above embodiment, an opening area of each opening 50 has a rectangular shape. However, the shape of the opening area is not limited to the rectangle shape, and may be for example oval. Alternatively, a circular or rectangular notch may be formed at each of four corners of the rectangular opening area. Through the above shape, an amount of laser light irradiation in the vicinity of each of the four corners of the opening region can be increased slightly and regions irradiated with laser light can each be set to a rectangular shape.

The present embodiment is applicable not only to TFTs using a silicon semiconductor but also TFTs using an oxide semiconductor.

The laser annealing apparatus according to the present embodiment includes a mask having a plurality of openings arranged in a matrix of rows and columns. The rows extend in a row direction parallel to a scanning direction. The columns extend in a column direction perpendicular to the scanning direction. The laser annealing apparatus moves at least one of the mask and a substrate in a direction parallel to the scanning direction, and irradiates a plurality of specific regions of the substrate with laser light through the openings. All or some of the openings are configured such that partial regions included in the specific regions are irradiated with the laser light. The openings are configured such that: between a specific region of the specific regions irradiated with the laser light through openings of one row opening group lying in the row direction and a specific region of the specific regions irradiated with the laser light through openings of another row opening group lying in the row direction, a number of times of laser light irradiation on partial regions that occupy congruent parts of the respective specific regions is equal; and at least two openings of at least one of opening groups lying in the column direction differ from each other in position or shape.

The laser annealing method according to the present embodiment is a laser annealing method implemented through use of the laser annealing apparatus according to the present embodiment, and includes: moving at least one of the substrate and the mask in the direction parallel to the scanning direction; and irradiating the substrate with laser light through the openings.

A mask according to an embodiment of the present invention is a mask having a plurality of openings that are arranged in a matrix of rows and columns and through which a plurality of specific regions of a substrate are irradiated with laser light. The rows extend in a row direction parallel to a scanning direction. The columns extend in a column direction perpendicular to the scanning direction. All or some of the openings are configured such that partial regions included in the specific regions are irradiated with the laser light. The openings in the mask are constituted such that: between a specific region of the specific regions irradiated with the laser light through openings of one row opening group lying in the row direction and a specific region of the specific regions irradiated with the laser light through openings of another row opening group lying in the row direction, a number of times of laser light irradiation on partial regions that occupy congruent parts of the respective specific regions is equal; and at least two openings of at least one of opening groups lying in the column direction differ from each other in position or shape.

All or some of the openings are configured such that the partial regions of the respective specific regions of the substrate are irradiated with the laser light. That is, the partial regions, which are respective parts of the specific regions, are irradiated with the laser light through the openings.

The openings are configured such that between a specific region of the specific regions irradiated with the laser light through openings of one row opening group lying in the row direction and a specific region of the specific regions irradiated with the laser light through openings of another row opening group lying in the row direction, the number of times of laser light irradiation on partial regions that occupy congruent parts of the respective specific regions is equal. The opening groups each include a plurality of openings arranged in a row. The partial regions that occupy congruent parts are partial regions that occupy congruent regions of respective two specific regions. Suppose for example that each of the specific regions is constituted by the three partial regions A, B, and C and the number of times of irradiation on the specific region is represented by N, the number of times of irradiation on each of the partial regions A, B, and C is N. In other words, the three partial regions A, B, and C are each irradiated with the laser light by N times through the openings of the opening group in one row. Likewise, the three partial regions A, B, and C are each irradiated with the laser light by N times through the openings of the opening group in another row. Thus, each of the irradiation regions of the substrate in the column direction can be each irradiated by N times with the laser light.

The openings are configured such that at least two openings of each opening group lying in the column direction differ from each other in position or shape. The openings arranged in the column direction are the same as one another in shape and size in a typical laser annealing apparatus. Therefore, dispersion in irradiation amount between the irradiation regions in different columns is more significant than dispersion in irradiation amount between the irradiation regions in the column direction, which serves as a cause of non-uniform scanning. At least two openings of an opening group lying in the column direction differ from each other in either position or shape. This can proximate dispersion in irradiation amount between the irradiation regions in the column direction to dispersion in irradiation amount between the irradiation regions in different columns, with a result that non-uniform scanning can be reduced.

At least two openings of an opening group lying in the column direction have different shapes. Through the above, partial regions of the irradiation regions in the column direction that are irradiated with laser light at the same time can have different shapes to disperse irradiation amounts among the irradiation regions in the column direction. As a result, non-uniform scanning can be reduced.

In the laser annealing apparatus according to the present embodiment, at least two openings of at least one of the opening groups lying in the column direction differ from each other in position in the row direction.

In the mask according to the present embodiment, the at least two openings of at least one of the opening groups lying in the column direction differ from each other in position in the row direction.

At least two openings of each opening group lying in the column direction differ from each other in position in the row direction. Through the above, the positions of the partial regions of the irradiation regions in the column direction that are irradiated with the laser light at the same time can be changed in the row direction (that is, the direction parallel to the scanning direction). Thus, the irradiation amount can be dispersed among the irradiation regions in the column direction, with a result that non-uniform scanning can be reduced.

In the laser annealing apparatus according to the present embodiment, any of the row opening groups lying in the row direction includes any one of: a combination of openings of which positions are changed in the row direction; a combination of openings of which positions are changed in the column direction; and a combination of at least an opening through which an entirety of a corresponding specific region is allowed to be irradiated with the laser light and a non-open opening that blocks the laser light.

In the mask according to the present embodiment, any of the row opening groups lying in the row direction includes any one of: a combination of openings of which positions are changed in the row direction; a combination of openings of which positions are changed in the column direction; and a combination of at least an opening through which an entirety of a corresponding specific region is allowed to be irradiated with the laser light and a non-open opening that blocks the laser light.

The openings of an opening group lying in the row direction may be a combination of openings of which positions are changed in the row direction. Alternatively, the openings of an opening group lying in the row direction may be a combination of openings of which positions are changed in the column direction. Alternatively, the openings of an opening group lying in the row direction may be a combination of at least an opening through which the entirety of the corresponding specific region is allowed to be irradiated with the laser light and a non-open opening that blocks the laser light.

Though the opening groups different in combination of openings as described above being arranged in the column direction, the specific regions as wholes can be equalized in the number of times of laser light irradiation and the positions of the partial regions which occupy the respective specific regions can be changed as appropriate, resulting in reduction in non-uniform scanning.

The configurations described in the respective embodiments can optionally be combined with one another, and new technical features can be formed through such combination.

REFERENCE SIGNS LIST

10 Substrate
21 Microlens
30 Mask
40 Mask portion
50 Opening

The invention claimed is:
1. A laser annealing apparatus comprising a mask having a plurality of openings arranged in a matrix of rows and columns, the rows extending in a row direction parallel to a scanning direction, the columns extending in a column direction perpendicular to the scanning direction, wherein
the laser annealing apparatus moves at least one of the mask and a substrate in a direction parallel to the scanning direction, and irradiates a plurality of specific regions of the substrate with laser light through the openings, all or some of the openings are arranged at parts of respective corresponding regions of the mask such that partial regions included in the specific regions are irradiated with the laser light, the corresponding regions of the mask each being a region corresponding to an opening through which an entirety of a corresponding specific region is capable of being irradiated with the laser light, and the openings are configured such that:

between a specific region of the specific regions irradiated with the laser light through openings of one row opening group lying in the row direction and another specific region of the specific regions irradiated with the laser light through openings of another row opening group lying in the row direction, a number of times of laser light irradiation on partial regions that occupy congruent parts of the respective specific regions is equal; and with respect to at least two openings of at least one of opening groups lying in the column direction, a position of one of the at least two openings in one of the corresponding regions is different from a position of another one of the at least two openings in another one of the corresponding regions, or the at least two openings of at least one of the opening groups lying in the column direction differ from each other in shape.

2. The laser annealing apparatus according to claim 1, wherein the at least two openings of at least one of the opening groups lying in the column direction differ from each other in position in the row direction.

3. The laser annealing apparatus according to claim 1, wherein any of the row opening groups lying in the row direction includes any one of:

a combination of openings of which positions are changed in the row direction;

a combination of openings of which positions are changed in the column direction; and a combination of at least an opening through which an entirety of a corresponding specific region is allowed to be irradiated with the laser light and a non-open opening that blocks the laser light.

4. A laser annealing method implemented through use of the laser annealing apparatus according to claim 1, the method comprising:

moving at least one of the substrate and the mask in the direction parallel to the scanning direction; and irradiating the substrate with the laser light through the openings.

5. A mask having a plurality of openings that are arranged in a matrix of rows and columns and through which a plurality of specific regions of a substrate are irradiated with laser light, the rows extending in a row direction parallel to a scanning direction, the columns extending in a column direction perpendicular to the scanning direction, wherein all or some of the openings are arranged at a parts of respective corresponding regions of the mask such that partial regions included in the specific regions are irradiated with the laser light, the corresponding regions of the mask each being a region corresponding to an opening through which an entirety of a corresponding specific region is capable of being irradiated with the laser light, the openings in the mask are constituted such that:

between a specific region of the specific regions irradiated with the laser light through openings of one row opening group lying in the row direction and another specific region of the specific regions irradiated with the laser light through openings of another row opening group lying in the row direction, a number of times of laser light irradiation on partial regions that occupy congruent parts of the respective specific regions is equal, and with respect to at least two openings of at least one of opening groups lying in the column direction, a position of one of the at least two openings in one of the corresponding regions is different from a position of another one of the at least two openings in another one of the corresponding regions, or the at least two openings of at least one of the opening groups lying in the column direction differ from each other in shape.

6. The mask according to claim 5, wherein the at least two openings of at least one of the opening groups lying in the column direction differ from each other in position in the row direction.

7. The mask according to claim 5, wherein any of the row opening groups lying in the row direction includes any one of:

a combination of openings of which positions are changed in the row direction;

a combination of openings of which positions are changed in the column direction; and a combination of at least an opening through which an entirety of a corresponding specific region is allowed to be irradiated with the laser light and a non-open opening that blocks the laser light.

* * * * *